United States Patent
Inoue (10) Patent No.: US 7,016,227 B2
(45) Date of Patent: Mar. 21, 2006

(54) NONVOLATILE RANDOM ACCESS MEMORY AND METHOD OF FABRICATING THE SAME

(75) Inventor: Yasukazu Inoue, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 5 days.

(21) Appl. No.: 10/921,214

(22) Filed: Aug. 19, 2004

(65) Prior Publication Data

US 2005/0041470 A1  Feb. 24, 2005

(30) Foreign Application Priority Data

Aug. 20, 2003 (JP) .............................. 2003-296252

(51) Int. Cl.
  *G11C 16/00* (2006.01)
(52) U.S. Cl. ................................. 365/185.08; 365/149
(58) Field of Classification Search ..................... None
  See application file for complete search history.

(56) References Cited

U.S. PATENT DOCUMENTS

| | | | | |
|---|---|---|---|---|
| 4,446,535 A | * | 5/1984 | Gaffney et al. | 365/185.2 |
| 4,707,807 A | * | 11/1987 | Cuppens et al. | 365/185.07 |
| 5,043,946 A | * | 8/1991 | Yamauchi et al. | 365/185.08 |
| 5,181,188 A | * | 1/1993 | Yamauchi et al. | 365/185.08 |
| 2003/0235095 A1 | * | 12/2003 | Inoue | 365/201 |

FOREIGN PATENT DOCUMENTS

| | | |
|---|---|---|
| JP | 06-244384 A | 9/1994 |
| JP | 07-111317 A | 4/1995 |
| JP | 07-153286 A | 6/1995 |
| JP | 08-171793 A | 7/1996 |
| JP | 2001-005723 A | 1/2001 |

* cited by examiner

*Primary Examiner*—Tan T. Nguyen
(74) *Attorney, Agent, or Firm*—Sughrue Mion, PLLC (57) ABSTRACT

The unit cell is constructed to have a volatile memory element provided with a capacitor element adapted to store and sustain an electric charge only in a state in which electric power is supplied, and a nonvolatile memory element adapted to save said electric charge stored in said capacitor element when the supply of said electric power is cut off. One end of said capacitor element is connected by way of said nonvolatile memory element to a potential supply line. Said nonvolatile memory element acts as a conductive element in a state in which said electric power is supplied and acts as a cut-off element in a state in which said electric power is not supplied, and in addition, has a threshold that varies in a case where the electric charge stored in said capacitor element corresponds to a predetermined potential level.

14 Claims, 9 Drawing Sheets

NONVOLATILE RANDOM ACCESS MEMORY AND METHOD OF FABRICATING THE SAME

BACKGROUND OF THE INVENTION

1. Field of the Invention

The present invention relates to a semiconductor memory device, particularly to a nonvolatile RAM (random access memory) capable of saving cell data even when an electric power supply is cut off.

2. Description of the Related Art

A DRAM (Dynamic RAM) is one kind of a semiconductor memory devices. Although the DRAM offers advantages of a large capacity, low cost and high-speed accessibility, one drawback has been that the cell data, which have been stored, are lost when the electric power supply is cut off.

For this reason, various nonvolatile RAMs have been proposed that have volatile memories and nonvolatile memories in combination. For example, JP 2001-5723 (hereinbelow, referred to as Patent Document 1) has proposed a multichip module in which a volatile memory such as a DRAM and a nonvolatile memory represented by a flash memory are mounted in a single package; a multichip package (MCP) in which the chips of volatile memories and the chips of nonvolatile memories are stacked one over another; and a hybrid-mounted chip in which both volatile memory and nonvolatile memory are mounted on the same chip. In the multichip module, MCP, and the hybrid-mounted chip, at the time when the power-supply potential rises (when the power supply is switched on), the data that have been stored in flash memory are transferred to the DRAM, and at the time when the power-supply potential falls (when the power supply is switched off), the data that have been written in the DRAM are transferred to the flash memory.

In addition to the above-described memory devices, the so-called FeRAM, in which nonvolatile material is employed in the capacitor of a memory cell, has long been proposed as a nonvolatile element. FeRAM is regarded as a promising memory device for mobile products having power-consumption-dependent performances, particularly for recent portable devices that require a large memory capacity for higher performance.

The above-described conventional nonvolatile RAMs, however, are problematic as described below.

In a multichip module and an MCP, need for a plurality of chips, employing special package structures, and necessitating specific software support and the like on the apparatus side that employs the memory device of interest, have entailed high costs and led to inferior versatility. Consequently, this has meant economic problems because cost reduction which result from mass production cannot be expected.

In a hybrid-mounted chip, mounting a flash memory and a DRAM on the same silicon substrate allows for the realization of low cost. However, since this memory device requires transfer of data stored in the DRAM to the flash memory in bit units, one drawback has been that the data transfer requires extra time. In order to remedy this drawback, it is necessary to provide, on the chip, a number of lead wires for I/O wiring to transfer data at the same time, entailing an enlargement of the size of the hybrid-mounted chip which will mean a cost disadvantage. But reducing the cost by reducing the number of wires will limit the amount of data that can be transferred. Thus, the hybrid-mounted chip at present has little practicability and has not been extensively employed yet.

Concerning FeRAM at present, since there are many problems to be solved, such as the stability of the material to be employed, the realization of large storage capacity has been delayed, and further, since FeRAM lacks continuity from existing technologies, mass production of FeRAM has not been attained. Thus, FeRAM has difficulties in material technology and size-reduction.

SUMMARY OF THE INVENTION

It is an object of the present invention to solve the above-described problems and to provide a low-cost and small-sized nonvolatile RAM that requires no time for data transfer in the event of a shut-down of an electric power supply, and also to provide a method of fabricating the same.

It is another object of the present invention to provide a memory system provide with such nonvolatile RAMs.

In order to attain the above described object, the nonvolatile random access memory, according to the present invention is constructed in such a manner that a volatile memory element that is provided with a capacitor element adapted to store and sustain electric charge only in a state in which electric power is supplied, and a nonvolatile memory element adapted to save the electric charge stored in the capacitor element when the supply of the electric power is cut off are provided, wherein one end of the capacitor element is connected by way of the nonvolatile memory element to a potential supply line for supplying the electric charge, and wherein the nonvolatile memory element acts as a conductive element in a state in which the electric power is supplied and acts as a cut-off element in a state in which the electric power is not supplied; and in addition, the nonvolatile memory element has a threshold that varies in cases where the electric charge stored in the capacitor element corresponds to a predetermined potential level.

The memory system according to the present invention is characterized by: the above-described nonvolatile random access memory; a detecting means for detecting supply of electric power from an external electric-power supply to said nonvolatile random access memory; and electric-power sustaining means for implementing supply of an electric power to said nonvolatile random access memory over a predetermined time duration when said detecting means detects a shut down of said supply of electric power to said nonvolatile random access memory.

The method of fabricating a nonvolatile random access memory, according to the present invention, has a unit cell made up of: a volatile memory element provided with a capacitor element adapted to store and sustain electric charge only in a state in which electric power is supplied; and a nonvolatile memory element provided with an electric-charge storage electrode adapted to save the electric charge stored in the capacitor element when the supply of the electric power is cut off; wherein one end of the capacitor element is connected by way of the nonvolatile memory element to a potential supply line for supplying the electric charge, including steps of stacking a pair of electrodes intended for the source and drain of the a nonvolatile memory element on the semiconductor substrate on which the volatile memory element is formed and forming the pair of electrodes to a predetermined pattern; sequentially depositing a dielectric layer and a silicon-based layer for the electric-charge storage electrode on the whole surface so as to cover the portion of the stacked pair of electrodes formed in the predetermined pattern; and implementing the anisotropic etching in such a manner that the deposited dielectric layer and the layer for the electric-charge storage electrode are left in the sidewall of the portion of the stacked pair of electrodes.

As described above, the nonvolatile random access memory according to the present invention acts as a sole conductive element in a state in which the electric power is supplied, thereby enabling write and read operations similar to, for example, DRAM, on the volatile memory element. The nonvolatile memory element, on the other hand, acts as a cut-off element in a state in which the electric power is not supplied. In this operation, when the electric charge stored in the capacitor element is in the state corresponding to a predetermined potential level, for example, the low level, the threshold value of the nonvolatile memory element shifts, while the other potential level causes no shift of the threshold value of the nonvolatile memory element. Thus, the threshold value of the nonvolatile memory element differs depending on whether the volatile memory element is in a state corresponding to the low level or it is in a state corresponding to the high level. The cell data can be saved through this difference of the threshold value (saving cell data). When the electric power is again supplied, the potential level, which depends on the threshold value of the nonvolatile memory element, is provided to the capacitor element. Thus, the original storage quantity of electric charge is given to the capacitor element (the restoration of the cell data). In this way, the save and restoration of cell data can be made with each memory cell or simultaneously in all memory cells without requiring the time for data transfer. In addition, since the memory cell is configured such that one end of the capacitor element is connected to the potential supply line through the nonvolatile memory cell, there is no need for a large number of I/O wires as in conventional cases.

Further, in the above described nonvolatile random access memory, it is possible to form the nonvolatile memory element using a TFT element and also it is possible to stack the volatile memory element and nonvolatile memory element on the same semiconductor substrate. Thus, a plurality of chips or specific package structures such as the multichip module or MCP are not required.

Furthermore, in the above described nonvolatile random access memory, it is possible to form one of a pair of electrodes intended for the source and drain of the nonvolatile memory element to be in common with the memory cells and it is also possible to form the control electrode of the nonvolatile memory element to be in common with the memory cells, thereby enabling downsizing and realizing a lower memory cost. Accordingly, cost reduction due to a mass-production effect can be expected in the application to DRAM.

The memory system, according to the present invention, allows a system capable of realizing the operations of the above described nonvolatile random access memory to be provided.

The method of fabricating a nonvolatile random access memory according to the present invention stacks the source and drain of a nonvolatile memory element and forms an electric-charge storage electrode on the sidewall of the stacked source and drain. Such a stack configuration (a vertical structure) allows a small chip area as compared with a planar configuration of electrodes.

The above and other objects, features, and advantages of the present invention will become apparent from the following description with reference to the accompanying drawings, which illustrate examples of the present invention.

DESCRIPTION OF THE PREFERRED EMBODIMENTS

Figure 1:
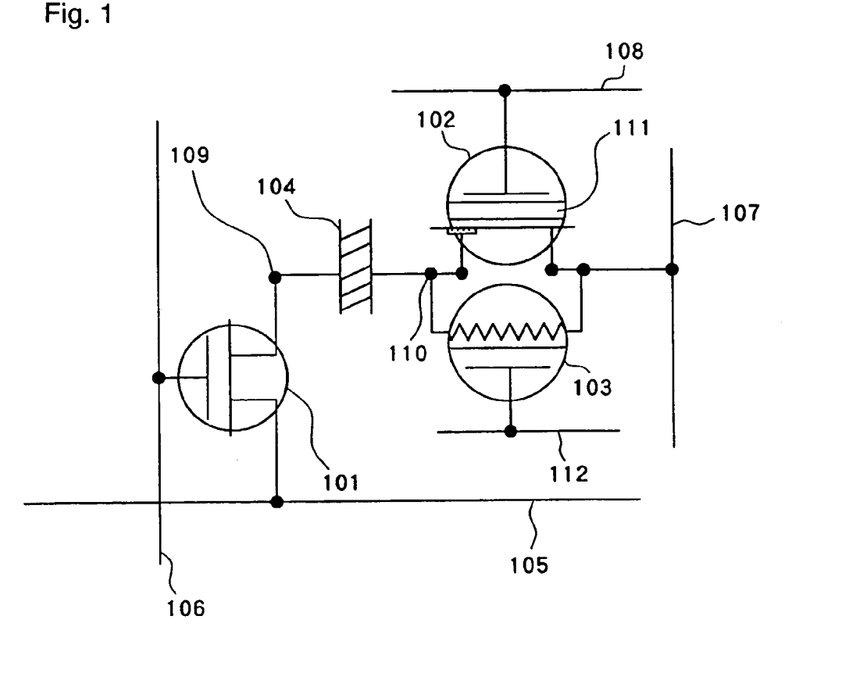
FIG. 1 is a circuit diagram illustrating the structure of a unit cell of an embodiment of the nonvolatile RAM according to the present invention.

FIG. 1 is a circuit diagram illustrating the unit cell of a nonvolatile RAM of the embodiment according to the present invention. The unit cell is a DRAM cell having MOS element 101 for selection with a control electrode connected to word line 106 and storage capacitor element 104 with one end connected to bit line 105 through MOS element 101. In one part of the DRAM cell, there are provided nonvolatile memory element 102 and TFT (Thin Film Transistor) 103 and nonvolatile memory element 102 having electric-charge-storage electrode 111 for saving the data stored in storage capacitor element 104. Nonvolatile memory element 102 can be a nonvolatile element such as EPROM, FLASH, EEPROM or the like and it is feasible to apply any existing structure to nonvolatile memory element 102. In the present embodiment, it is provided to employ the TFT structure.

Both ends of storage capacitor element 104 are adapted to counter-electrodes 109, 110. One of the counter-electrodes 109 is connected to one of the drain-source electrodes (whereas any of the drain and source electrodes may be used, for purposes of explanation, it is assumed that the electrodes is a drain). The other of counter-electrodes 110 is connected both to one of the electrodes of nonvolatile memory element 102 and to one of the electrodes of TFT 103 (whereas any of the drain and source electrodes may be used, for purposes of explanation, it is assumed that the electrodes is a source). The other electrodes (drains) of both nonvolatile memory element 102 and TFT 103 are connected together to potential supply line 107. The control electrode of nonvolatile memory element 102 is connected to control line 108 and the control electrode of TFT 103 is connected to control line 112. Control lines 108 and 112 can be realized as a common line.

Figure 2:
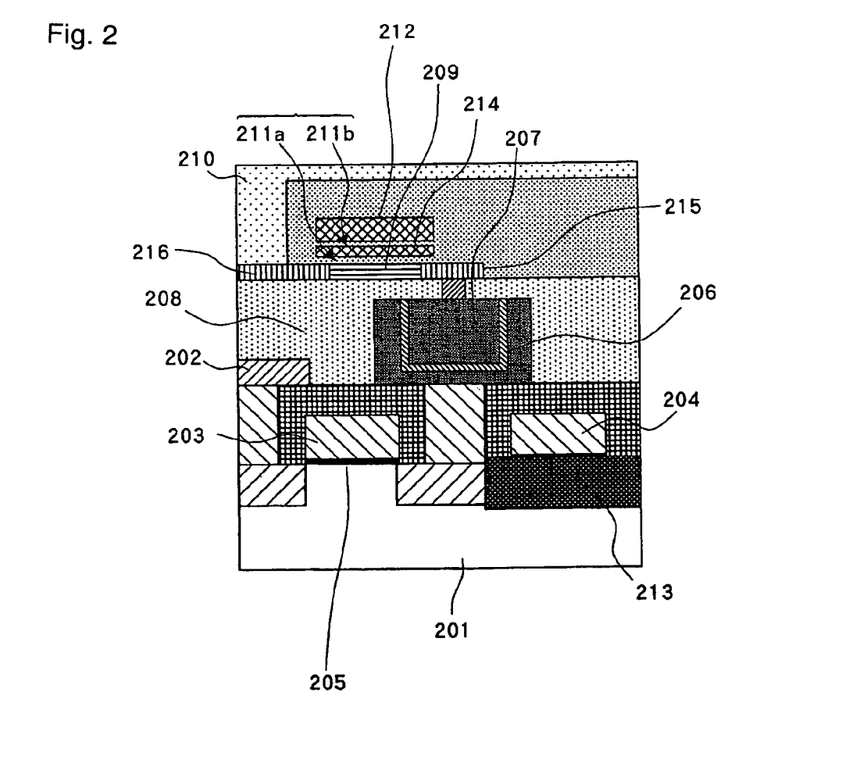
FIG. 2 is a structural cross-sectional view illustrating the unit cell shown in FIG. 1 taken in the direction of the bit line.

FIG. 2 shows a structural cross-sectional view of the unit cell illustrated in FIG. 1 as viewed in the direction of the bit line. Bit electrode 202, isolation dielectric layer 213, gate oxide layer 205, word electrode 203, 204, and capacitor electrode 206 are formed on p-type silicon substrate 201 in predetermined order, wherein bit electrode 202, word electrode 203 and capacitor electrode 206 correspond to bit line 105, word line 106 and counter-electrode 109, respectively, as shown in FIG. 1. In addition, word line 204 is a word line of an adjacent cell. Since this process is a well-known process of fabricating DRAM cells, detailed explanation will herein be omitted.

After forming capacitor electrode 206, capacitor counter-electrode 207 (corresponding to counter-electrode 110 of FIG. 1) is embedded in the formed capacitor electrode 206 in an insulated manner. All these electrodes are thereafter covered with dielectric layer 208, and then an opening is provided at a predetermined position of dielectric layer 208 to expose the surface of capacitor counter-electrode 207. Subsequently, a thin film of a-Si (amorphous silicon) is grown over a predetermined area inclusive of the opening at a low temperature to form TFT substrate 209 and also TFT source electrode 215 and TFT drain electrode 216 are formed into predetermined regions of TFT substrate 209, wherein TFT source electrode 215 and TFT drain electrode 216 correspond to the source electrode and drain electrode, respectively, of nonvolatile memory element 102 as shown in FIG. 1.

Next, gate insulation layer 211a of nitrogen oxide and electric-charge-storage gate electrode 214 of a-Si (corresponding to electric-charge-storage electrode 111 of FIG. 1) are sequentially formed over a predetermined region on TFT substrate 209 and these are further formed into predetermined shapes by a well-known method. In the following step, gate insulation layer 211b of nitrogen oxide is again formed by the vapor-phase growth, and TFT gate electrode 212 (corresponding to the control electrode of nonvolatile memory element 102 shown in FIG. 1) is formed, which are then formed to a desired shape. At this time, the shape of electric-charge-storage gate electrode 214 is decided to be the shape of the superposed section of gate electrode 212 and TFT substrate 209, depending on the shapes of gate electrode 212 and TFT substrate 209. Next, the entirety is covered with a dielectric layer and smoothened on its surface by an existing means, and an opening is provided at a portion of the surface to expose the surface of TFT drain electrode 216. Forming low-resistivity wiring formed of W on a predetermined area inclusive of the opening provides potential supply electrode 210, which corresponds to potential supply line 107 shown in FIG. 1. Since the processes thereafter are identical to the well-known processes for fabricating DRAMs, detailed explanation thereof is omitted in the present disclosure.

The above-described fabrication process allows MOS element 101, a volatile memory element having storage capacitor element 104, and nonvolatile memory element 102, to be stacked on the same semiconductor substrate, thereby enabling provision of a nonvolatile RAM of low cost and small chip area.

Explanation is next presented regarding the operation of the nonvolatile RAM of the present embodiment. The nonvolatile RAM operates as a complete DRAM to store and hold an electric charge in storage capacitor element 104 in a normal operation mode, i.e., in the state in which a predetermined potential is supplied from potential supply line 107. When the power supply is shut down (the power-supply shut-down mode), or when no access is executed (the stand-by mode), the stored electric charge in storage capacitor element 104 (the cell data) is saved in electric-charge-storage electrode 111 of nonvolatile memory element 102 (the cell-data save operation). When the power supply is turned on, or when a transition is made from the stand-by mode to the access mode, the electric charge, having been stored in electric-charge-storage electrode 111, is stored in storage capacitor element 104 and retained in it (the cell-data restoration operation).

The potential from potential supply line 107 is determined according to each operation mode as described above. Specifically, a potential such as potential "Vcc/2", a high potential greater than or equal to potential "Vcc", or potential "GND" is supplied from potential supply line 107 according to a situation of operation.

Figure 3:
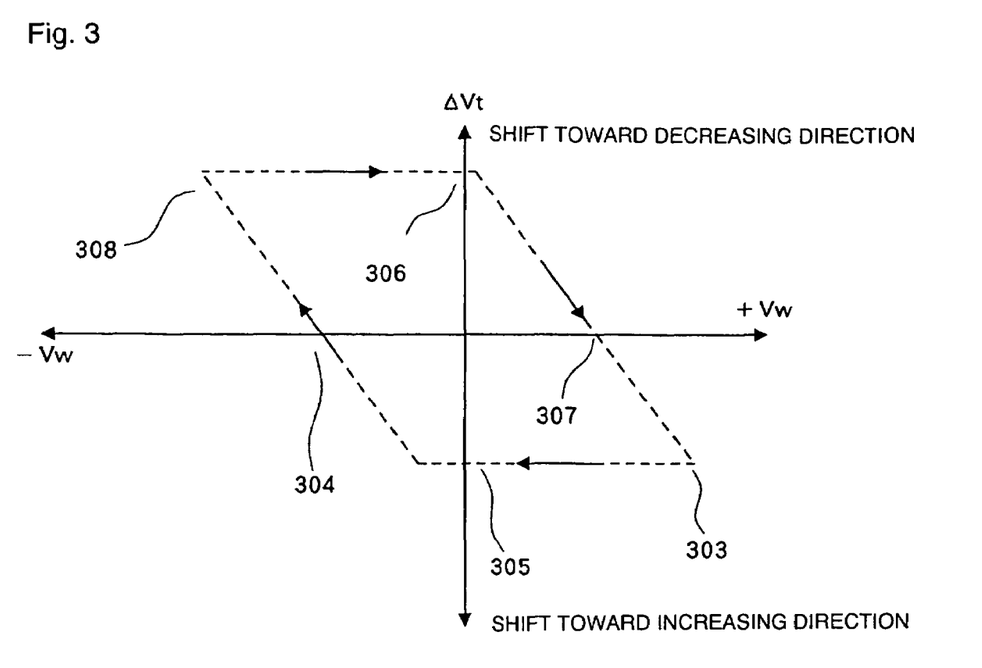
FIG. 3 is a schematic diagram representing an example of hysteresis characteristics.

For the above-described save and restoration operations of cell data, the hysteresis characteristic of the threshold value of nonvolatile memory element 102 (in more general terms, the injection characteristic) can be utilized. FIG. 3 represents the hysteresis characteristic. In FIG. 3, the ordinate represents the variation of the threshold ΔVt and the abscissa represents the applied voltage Vw. The numerals 305, 306 denote threshold values after a write operation, corresponding to cell data "0" and "1", respectively, in the explanation of the operation described later. Numerals 304, 307 are the limit application voltages with which the variation of the threshold starts. The state shown in FIG. 3 illustrates the case in which writing is made through the lower electrode, while the reverse write characteristic is realized if the write electrode is provided in the upper electrode.

Referring now to FIG. 3, potential 307 (the limit application voltage) is set up as an initial write threshold of nonvolatile memory element 102. When applying, as applied voltage Vw, the voltage 303 which is equal to or higher than potential 307, a negative electric charge is injected into the float electrode (storage capacitor element 104), resulting in the shift toward the increasing direction of the threshold value of nonvolatile memory element 102 to attain potential 305. This change in the threshold is still sustained in the state in which applied voltage Vw is "0". In this state, nonvolatile memory element 102 acts as a cut-off element.

Next, when applied potential –Vw is applied, discharge of negative electric charge is caused from the float electrode, resulting in the shift toward the decreasing direction of the threshold value of nonvolatile memory element 102. At applied voltage (–Vw) 308, the threshold value of nonvolatile memory element 102 shifts from potential 305 to potential 306. This change in the threshold is still sustained in the state in which applied voltage −Vw is "0". In this state, nonvolatile memory element 102 acts as a conductive element.

In discharge of negative electric charge from the float electrode, for example, a potential at gate electrode is 0V and a potential at drain electrode (potential supply line 107 side) is a high potential to discharge the negative electric charge.

Next, when again applying, as applied voltage Vw, voltage 303, the threshold value of nonvolatile memory element 102 shifts from potential 306 to potential 305, causing nonvolatile memory element 102 to act again as a cut-off element.

Nonvolatile memory element 102, capable of reversibly varying the threshold value of the element as described above, is known as flash memory. In addition, nonvolatile memory element 102 can be employed as a drift mode element. In this case, while the shift of the threshold value is caused in the directions reverse to the directions of the arrows as shown in FIG. 3, similar switching between the operations of the cut-off element and conductive element is realized.

The nonvolatile RAM of the present embodiment performs the save and restoration of cell data through utilizing the hysteresis characteristic of the threshold value of nonvolatile memory element 102 as described above. Specifically, nonvolatile memory element 102 acts as a conductive element when the power supply is in a state of on and acts as a cut-off element when the power supply is in a state of off, and also has a threshold value that varies when the electric charge stored in storage capacitor element 104 causes a predetermined potential level to be generated. Explanation is hereinafter presented regarding a specific operation thereof.

In the circuitry shown in FIG. 1, if nonvolatile memory element 102 or TFT element 103 is in a conductive state, then an electric charge is stored in storage capacitor element 104 through the same operation as the conventional DRAM and reserved there. If a potential that is no lower than the potential 304 and also no higher than the potential 307, as shown in FIG. 3, is applied to the control electrode of nonvolatile memory element 102 through control line 108, then nonvolatile memory element 102 becomes conductive. TFT 103 takes a conductive state when applying a predetermined voltage to the control electrode of TFT 103 by way of control line 112.

In a conventional DRAM, after the power supply makes a transition from the on state to the off state, the electric charge stored in a memory cell (at the high level) is gradually lost with time finally to vanish on account of leakage current toward the silicon substrate. In the present embodiment, the operation described hereinafter is performed, by saving the storage charge information (the cell data), stored in storage capacitor element 104, into nonvolatile memory element 102 before the electric power is substantially cut off, thereby ensuring the nonvolatile characteristic for cell data.

In the cell-data save operation, voltage required for turning off TFT element 103 is supplied to control line 112, and also the range of the voltage that causes nonvolatile memory element 102 to be turned off and also causes no writing is supplied to control line 108. In the present embodiment, negative voltage is applied to control line 108. Storage capacitor element 104 is thus electrically isolated from potential supply line 107 to be placed in a floating state that is electrically insulated and independent of the potential of the potential supply line 107. In addition, although storage capacitor element 104, in actuality, is connected to potential supply line 107 by way of nonvolatile memory element 102, storage capacitor element 104 can be handled as being in an OFF state in an operation of normal speed, specifically in the operation of the write-in or read-out speed in a conventional DRAM cell, because the resistance of nonvolatile memory element 102 is sufficiently high.

After placing storage capacitor element 104 in the floating state as described above, bit line 105 and word line 106 are placed in the high level at the same time. Then the threshold value of nonvolatile memory element 102 shifts depending on whether or not storage capacitor element 104 is in the low level state.

In the case where storage capacitor element 104 is in a low level state, the node potential in counter-electrode 109 is raised from the low level to the high level. The node potential at counter-electrode 110 in the counter-electrode position opposite to counter-electrode 109, as well, is raised from the low level to the high level through capacity coupling with the TFT substrate. Consequently, supplying an appropriate application voltage to control line 108 allows a voltage equal to or higher than the limit write voltage to be applied to the control electrode of nonvolatile memory element 102 corresponding to the potential rise through capacity coupling with the TFT substrate, whereby the threshold value of nonvolatile memory element 102 shifts toward the higher side corresponding to the increment (the potential rise), as shown in FIG. 3.

Specifically, in the case where storage capacitor element 104 is in a low level state in the cell-data restoration operation, in nonvolatile memory element 102, a high voltage is applied to gate electrode and also a high voltage is applied to source electrode (counter-electrode 110 side) by an influence of the potential rise in storage capacitor element 104. In this case, when potential "0V (GND)" is applied to drain electrode, the negative electric charge (channel hot—electron) generated in close to source electrode can be supplied to float electrode (111). Consequently, the threshold value of nonvolatile memory element 102 shifts toward the higher side.

In the case where storage capacitor element 104 is in a high level state, on the other hand, the node potential at counter-electrode 109 is kept unchanged causing no change in the node potential at counter-electrode 110, whereby, in this case, nonvolatile memory element 102 sustains a threshold value established in the initial state.

As described above, simultaneously putting both of bit line 105 and word line 106 in the high level after placing storage capacitor element 104 in the float state, causes the threshold value of nonvolatile memory element 102 to shift toward the higher side only in the case where storage capacitor element 104 is in the low-level state. Specifically, if storage capacitor element 104 is in the low-level state, the threshold value of nonvolatile memory element 102 shifts toward the higher side, while if storage capacitor element 104 is in the high-level state, the threshold value of nonvolatile memory element 102 is kept at a value established in the initial state. Thus, the storage electric-charge information of storage capacitor element 104 (the cell data) can be saved even after a cutoff of the power supply in terms of the state of nonvolatile memory element 102 having a different threshold.

After saving the cell data, when the power supply is turned on, TFT 103 is initially put in the off state and nonvolatile memory element 102 is supplied with potential 305 shown in FIG. 3 through control line 108. In the case where nonvolatile memory element 102 holds the low level as the original cell data, nonvolatile memory element 102 keeps the off state even when the potential of potential supply line 107 is raised, because the threshold value maintains the value shifted toward the higher side. In this case, no voltage rise takes place at the node in counter-electrode 110. In this state, if the well-known refreshing of DRAM is performed, the low level is maintained, because no electric charge can be stored in storage capacitor element 104. In the case where nonvolatile memory element 102 holds the high level as an original cell data, the threshold value of nonvolatile memory element 102 maintains its initial value. Accordingly, nonvolatile memory element 102 makes a transition to the on state as the potential of potential supply line 107 rises. Since counter-electrode 110 is connected to potential supply line 107 in this case, the potential of the node thereof is raised. In this state, when the conventional refresh operation of DRAM is performed, an electric charge is stored in storage capacitor element 104, thereby causing storage capacitor element 104 to be placed in the high-level state. In this way, the cell data at the time of the cutoff of the power supply is written into storage capacitor element 104 (the restoration of cell data).

After restoration of the cell data, application of voltage no lower than the limit write voltage (potential 304 of FIG. 3) to the control electrode of nonvolatile memory element 102 causes nonvolatile memory element 102 to shift its threshold value to the lower side and enter the conductive state. This shift of the threshold causes the cell data saved in nonvolatile memory element 102 to be erased, resulting in restoring nonvolatile memory element 102 to the initial state. Simultaneously with this restoration operation of nonvolatile memory element 102 to the initial state, a predetermined voltage is applied to the control electrode of TFT element 103 through control line 112, whereby TFT element 103 enters the conductive state. This enables the concerned memory cell to act as conventional DRAM.

When the power supply is again cut off after start-up of the operation as conventional DRAM, the above described save and restoration operations are repeated. This enables the stable operation of the DRAM cell as if it were a nonvolatile element.

The above described nonvolatile RAM of the present embodiment allows a significant reduction of the chip area by constructing the nonvolatile memory element 102 through the use of a TFT element, as compared to the case in which nonvolatile memory element 102 other than the TFT element is formed on a silicon substrate.

Furthermore, arranging TFT element 103 in parallel to nonvolatile memory element 102 guarantees the stable operation as a DRAM independently of fluctuation in according with the characteristics of nonvolatile memory element 102.

Still further, while the present embodiment is configured to provide both nonvolatile memory element 102 and TFT element 103, it is also feasible to construct the nonvolatile random access memory cell without TFT element 103. In this case, the above described save and restoration operations are carried out only through nonvolatile memory element 102.

Furthermore, in the cell-data save operation, it is feasible to temporarily raise the supplied voltage through the use of a conventional booster circuit or the like; then carry out the refresh operation, and raise the high level of the cell as high as possible. This allows reduction of the write time to nonvolatile memory element 102. When the transition to the high level is to be made, it is also feasible to raise the potentials of the word lines of all cells at the same time or selectively to a high potential.

Furthermore, the polarity of the write potential can also be reversed. In this case, while the threshold of nonvolatile memory element 102 shifts toward the lower direction only when the cell data is in the high level, the memory cell eventually provides the save and restoration operations of the cell data similar to the corresponding operations described above.

While FIG. 1 illustrates only one unit cell structure, a plurality of such unit cells are arranged and the above described save and restoration operations of cell data are in actuality, performed in each cell.

(Other Embodiments)

Figure 4:
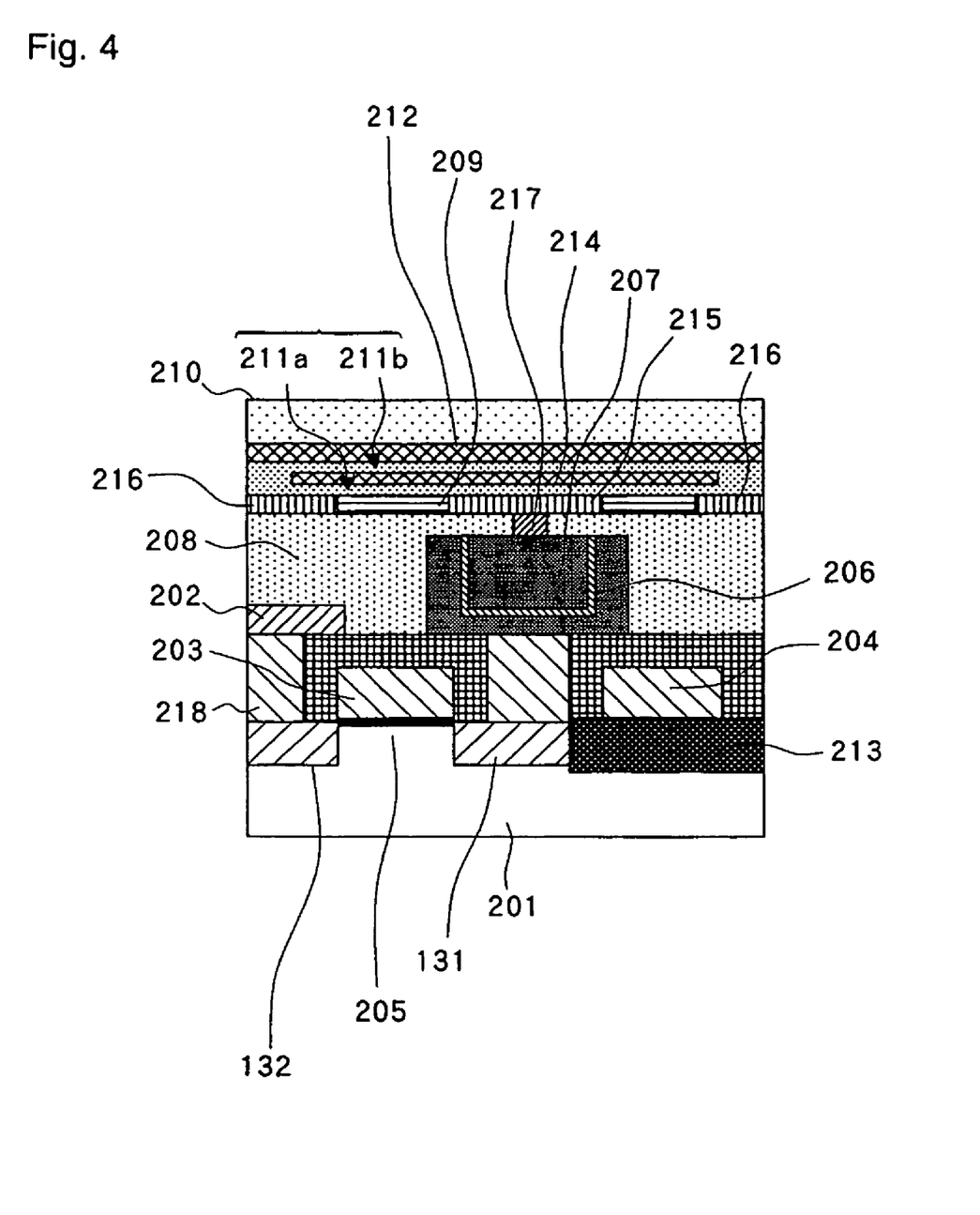
FIG. 4 is a structural cross-sectional view illustrating the cell structure of the first variation of the nonvolatile RAM according to the present invention.

The unit-cell circuitry of the nonvolatile RAM shown in FIG. 1 can be realized by applying various integrated-circuit structures other than the structure illustrated in FIG. 2. For example, TFT gate electrode 212 can be formed to cover electric-charge-storage gate electrode 214 as illustrated in FIG. 4. In this cell structure, while TFT drain electrode 216, which serves as a drain electrode of nonvolatile memory element 102, and TFT source electrode 215, which serves as a source electrode of nonvolatile memory element 102, are formed in TFT substrate 209, TFT drain electrode 216 is configured to surround TFT source electrode 215. Furthermore, electric-charge-storage gate electrode 214 covers the area that includes the entirety of TFT source electrode 215 and the portions of TFT drain electrode 216 adjacent to the outer periphery of TFT source electrode 215.

Figure 5:
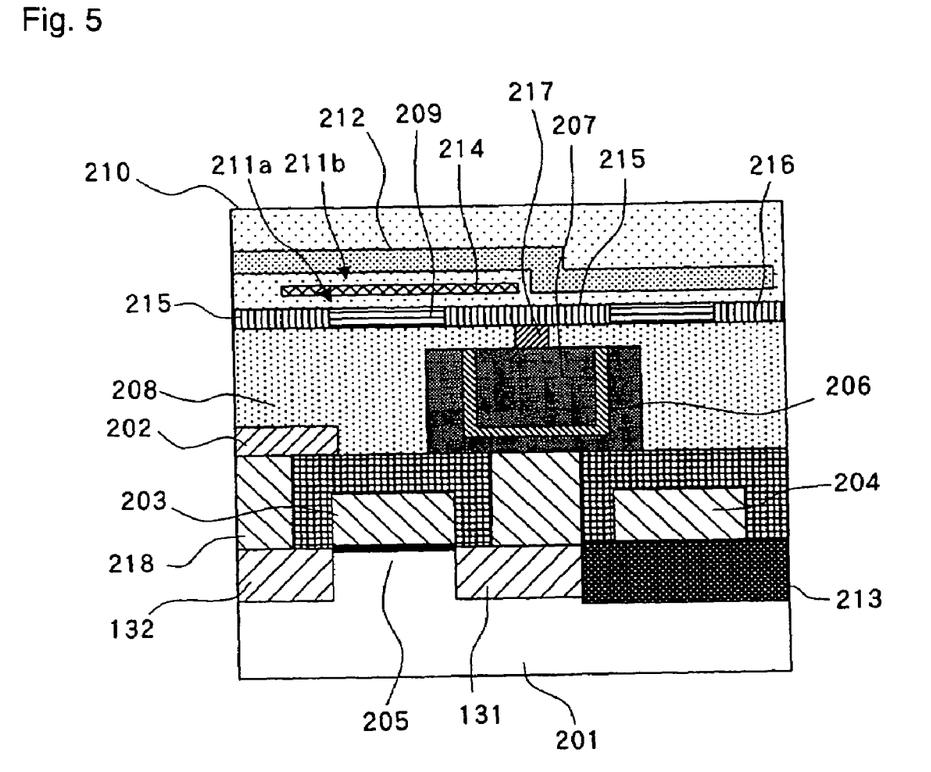
FIG. 5 is a structural cross-sectional view illustrating the cell structure of the second variation of the nonvolatile RAM according to the present invention.

Alternatively, as shown in FIG. 5, electric-charge-storage gate electrode 214 can be configured to partly cover TFT source electrode 215 and TFT drain electrode 216. In this configuration, TFT gate electrode 212 has a step at the position adjacent to the edge of electric-charge-storage gate electrode 214 that is disposed above TFT source electrode 215.

Figure 6A:
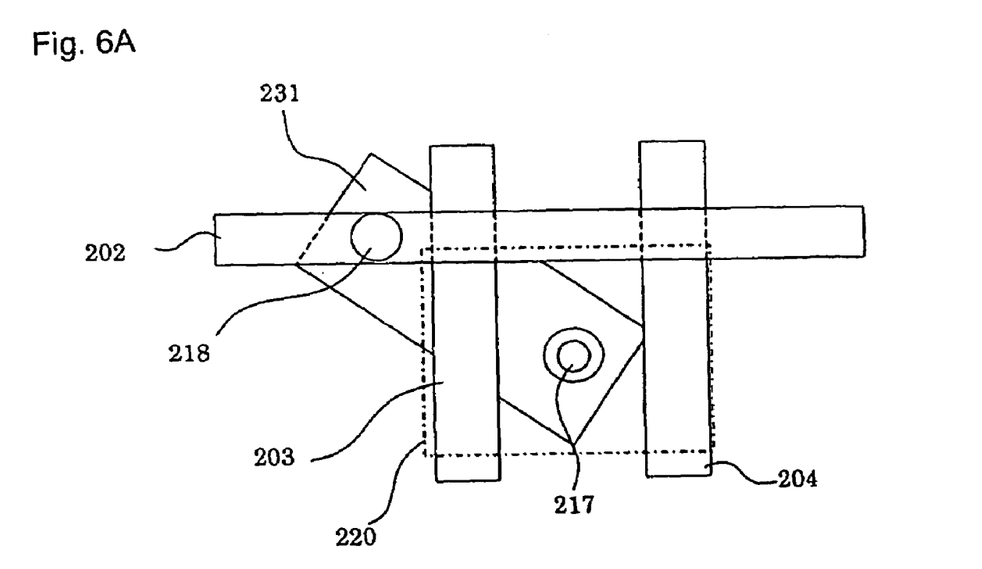
FIG. 6A is a plan view of the common section in the lower layer of the cell structure shown in FIG. 4 and FIG. 5.
Figure 6B:
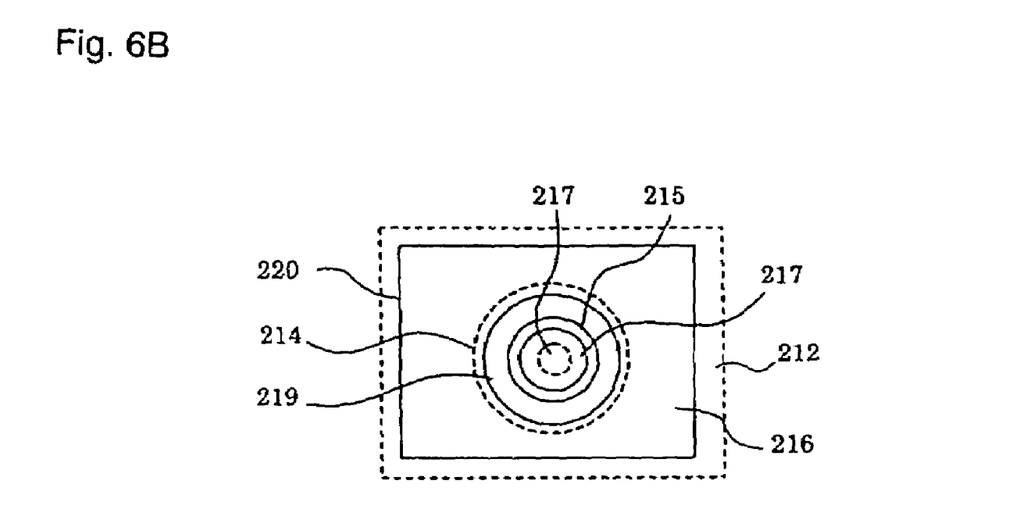
FIG. 6B is a schematic diagram of the common electrode section in the cell structure shown in FIG. 4.
Figure 6C:
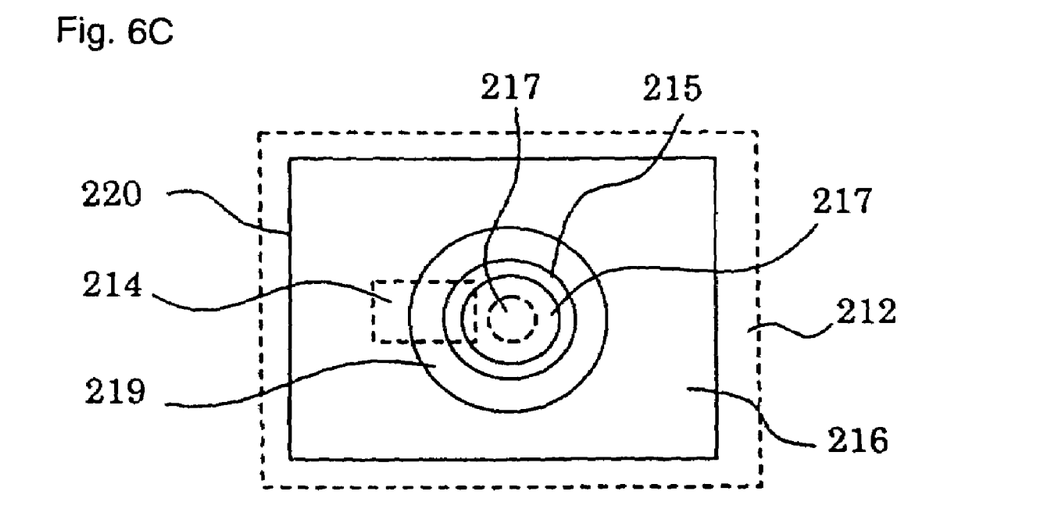
FIG. 6C is a schematic diagram of the common electrode section in the cell structure shown in FIG. 5.

Specific explanation is hereinafter presented regarding the respective features of a first variation of the embodiment, i.e., the cell structure illustrated in FIG. 4, and a second variation of the embodiment, i.e., the cell structure illustrated in FIG. 5. FIG. 6A is a plan view of common parts in the lower portions (the portions below the bit lines) of the cell structures of the first and second variations; FIG. 6B is a schematic diagram of the common electrode section shown in FIG. 6A in the cell structure of the first variation; and FIG. 6C is a schematic diagram of the common electrode section shown in FIG. 6A in the cell structure of the second variation; wherein the plan view represented in FIG. 6A is a plan of the lower portion in the cell structure shown in FIG. 4 and FIG. 5, as viewed from the side of potential supply electrode 210.

Referring to FIG. 6A, bit electrode 202 is arranged to intersect with word electrodes 203, 204. Contact hole 218 is formed in the position on bit electrode 202 near the intersection of bit electrode 202 with word electrode 203 (in the position across word electrode 203 from word electrode 204) to provide an electrical connection to MOS element 101 shown in FIG. 1. Bit electrode 202 is electrically connected through contact hole 218 to source/drain region 231 (corresponding to source electrode 131 and drain electrode 132 shown in FIG. 4 and FIG. 5), disposed in the lower layer than this bit electrode 202. This source/drain region 231 corresponds to the source/drain of MOS element 101 shown in FIG. 1. In the region between word electrodes 203 and 204, contact hole 217 is formed to provide an electric connection between nonvolatile memory element 102 and storage capacitor element 104 shown in FIG. 1. Source/drain region 231 has a rectangular shape so as to connect linearly between contact holes 217 and 218, as viewed from the upper surface side of the substrate.

In the area positioned in a layer lower than contact hole 217, there are formed capacitor electrode 206 and capacitor counter-electrode 207, and in the area positioned in a layer higher than contact hole 217, there are formed TFT gate electrode 212, TFT source electrode 215, electric-charge-storage gate electrode 214 and TFT drain electrode 216. Of these electrodes in the first and second variations, TFT gate electrode 212 and TFT drain electrode 216 can be shared by a plurality of the memory cells.

Explanation is first presented referring to FIG. 6B regarding the structure of the common electrode section in the cell structure of the first variation. FIG. 6B is a view of common-electrode cutout section 220 depicted with a broken line in FIG. 6A, as viewed from capacitor counter-electrode 207. In order from the front side as viewed in the direction of the drawing, there are sequentially stacked capacitor counter-electrode 207, contact hole 217, TFT substrate (including TFT gate electrode 212, TFT source electrode 215, TFT drain electrode 216 and TFT channel region 219) and electric-charge-storage gate electrode 214. Capacitor counter-electrode 207 has a circular form in a cross-section taken along the plane of the substrate surface. TFT source electrode 215 also has a circular form and is arranged to cover capacitor counter-electrode 207 through contact hole 217 as viewed from the upper surface side of the substrate. TFT drain electrode 216 is provided to surround TFT source electrode 215 thereby providing TFT channel region 219 between these electrodes. Electric-charge-storage gate electrode 214 has a circular form and is formed to cover both the region including TFT source electrode 215 and TFT channel region 219 and the region including the portion of TFT drain electrode 216 which is adjacent to the outside peripheral area (TFT channel region 219) of TFT source electrode 215.

In the above described structure, TFT gate electrode 212 and TFT drain electrode 216 are formed over a plurality of the memory cells to be shared by the cells. Sharing of TFT gate electrode 212 makes the component-isolation field between nonvolatile memory element 102 and TFT element 103 unnecessary. In addition, sharing of TFT gate electrode 212 and TFT drain electrode 216 enables reduction of the wiring of these electrodes. Thus, the cell structure of the first variation allows simplification of the manufacturing process.

Explanation is next presented regarding the structure of the common electrode section in the cell structure of the second variation referring to FIG. 6C. FIG. 6C is a view of common-electrode cutout section 220 depicted with a broken line in FIG. 6A, as viewed from capacitor counter-electrode 207. This common electrode section has the same structure as that shown in FIG. 6B except that electric-charge-storage gate electrode 214 has some different aspect differs. Electric-charge-storage gate electrode 214 has a rectangular form and is arranged to partly cover each of TFT source electrode 215, channel region 219 and TFT drain electrode 216. This cell structure allows isolation between nonvolatile memory element 102 and TFT element 103 and alleviates delicate control of the threshold value of nonvolatile memory element 102.

In the above described first and second variations, nonvolatile memory element 102 and TFT element 103 can be formed on the same TFT substrate and these elements can share TFT gate electrode 212 and TFT drain electrode 216.

Although the above explanation exemplifies the case in which a TFT structure is adopted for the nonvolatile memory element, the present invention is not necessarily limited to this case. The nonvolatile memory element can be formed through planar deployment on a silicon substrate.

In addition, while the write of cell data into nonvolatile memory element is performed solely at the time of power-off, the allowable number of the write times is considered to be finite on an actual memory system. As a result, when applying the nonvolatile RAM device of the present invention, the RAM device undergoes constraints due to the number of write times. However, even the devices having frequently switched power supplies, such as portable telephones, the number of on/off operations of a power supply is considered to be about 10 times per day. Accordingly, it can be presumed that the on/off switching number of a power supply of about 30,000 is a sufficient estimation for 10-year use. In this case, the rewrite performance required of the nonvolatile memory element will be considerably alleviated as compared to the rewrite performance of the switching number of 100,000 to 1,000,000 or more required for conventional nonvolatile RAM. For this reason, in applying the nonvolatile RAM of the present invention to the devices such as a portable telephone, it will be possible to provide sufficiently stable operations even when a currently used TFT element is used.

Figure 7:
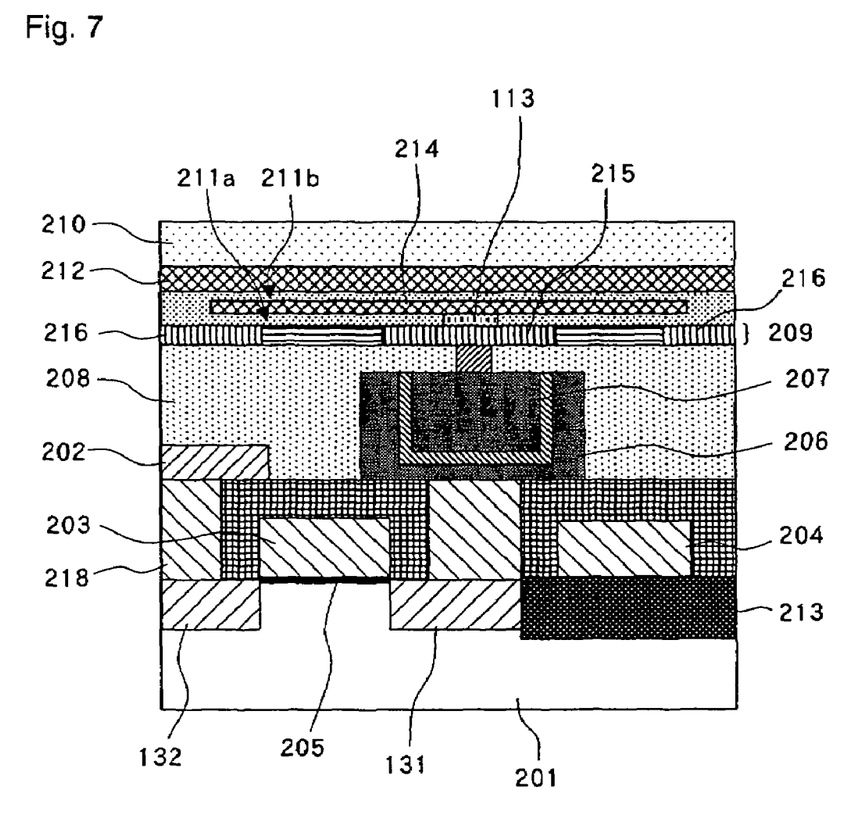
FIG. 7 is a structural cross-sectional view illustrating the cell structure of an alternative example of the nonvolatile RAM according to the present invention.

It is also possible in the nonvolatile RAM of each embodiment to provide a window for injecting an electric charge (electric-charge injecting window) in a part of gate insulation layer 211a formed under electric-charge-storage gate electrode 214, and which is thinner than electric-charge-storage gate electrode 214. As shown in FIG. 7, for example, electric-charge injecting window 113 can be provided that is made of a dielectric film thinner than the thickness of gate insulation layer 211a in a portion of gate insulation layer 211a formed under electric-charge-storage gate electrode 214, located above TFT source electrode 215 of TFT substrate 209. In this case, an electric-field strength is enhanced and the injection efficiency of the electric charge can be enhanced in accordance with the capacity coupling principle, thereby shortening the time required for saving cell data (the rewrite time). This electric-charge injecting window 113 is applicable to the cell structures as illustrated FIG. 2 and FIG. 5, as well.

Furthermore, it is also possible to use, as nonvolatile memory element 102, a TFT element known as a vertical MOS structure. While the fabrication process becomes complex, it is further possible for the sake of size-reduction to arrange the source and drain electrodes of nonvolatile memory element 102 perpendicularly to the surface of the TFT substrate to configure the electric-charge-storage gate electrode in a vertical structure. The explanation hereinafter regards a specific structure and the process of fabricating thereof.

FIG. 8A to FIG. 8E represent steps in a process of fabricating the vertical structure of the nonvolatile memory element section in the nonvolatile RAM according to the present invention. These steps are included in a process post forming capacitor counter-electrode 207 in the cell structure as shown in FIG. 4.

Figure 8A:
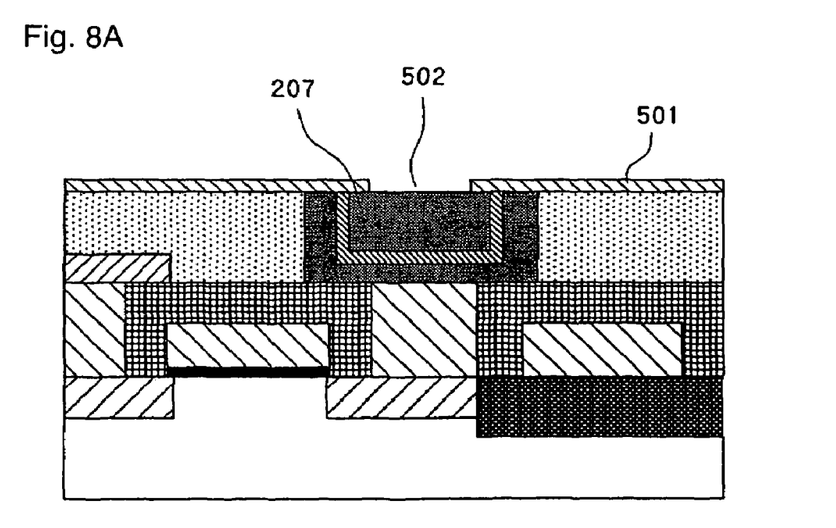
FIG. 8A is a cross-sectional view illustrating the fabrication process of the vertical structure of the nonvolatile RAM according to the present invention.
Figure 8B:
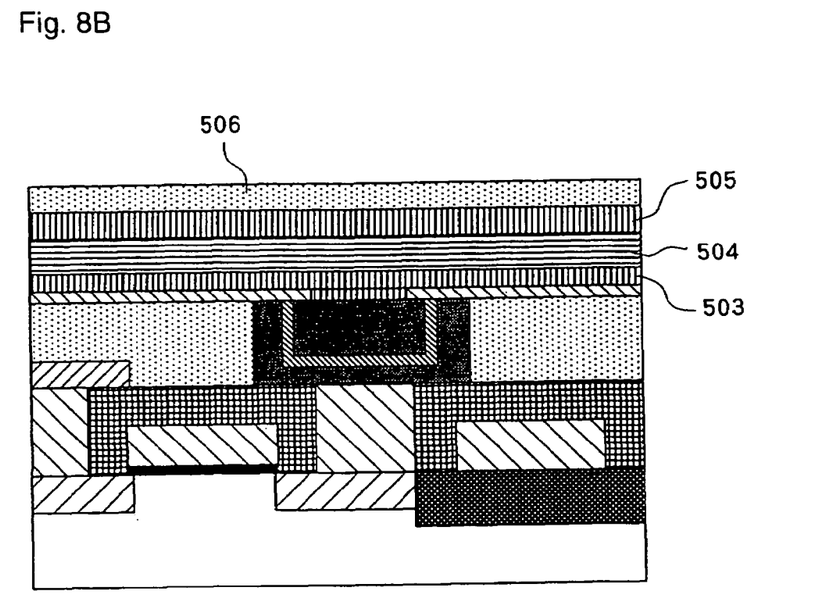
FIG. 8B is a cross-sectional view illustrating the fabrication process of the vertical structure of the nonvolatile RAM according to the present invention.
Figure 8C:
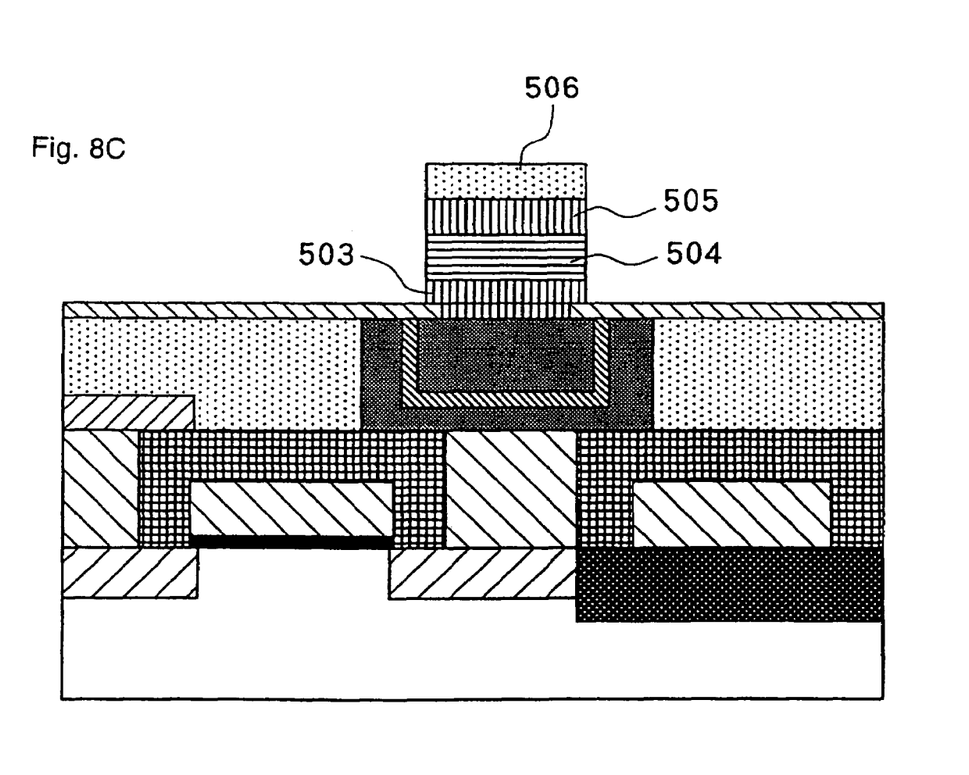
FIG. 8C is a cross-sectional view illustrating the fabrication process of the vertical structure of the nonvolatile RAM according to the present invention.

First, a dielectric film 501 is formed on the overall surface and an opening 502 is provided in a part of dielectric film 501 to expose the surface of capacitor counter-electrode 207 as shown in FIG. 8A. In the subsequent steps, TFT source electrode 503 composed of polycrystalline silicon containing impurities is formed on dielectric film 501 as shown in FIG. 8B; TFT substrate 504 is formed on TFT source electrode 503 by growing an a-Si layer to a desired thickness by means of sputtering; and TFT drain electrode 505 is formed by converting the electric conductivity of a part of TFT substrate 504 to be conductive by means of the ion-injection process or the like. Next, dielectric layer 506 made of a silicon oxide layer is formed on TFT drain electrode 505 by means of, for example, vapor-phase growth or low-temperature oxidation, and the stack section provided by stacking TFT source electrode 503, TFT substrate 504, TFT drain electrode 505 and dielectric layer 506 is formed in a desired pattern that covers opening 502, thereby providing a structure as shown in FIG. 8C. In this patterning, selective ablation is effected through, for example, the dry-etching process.

Figure 8D:
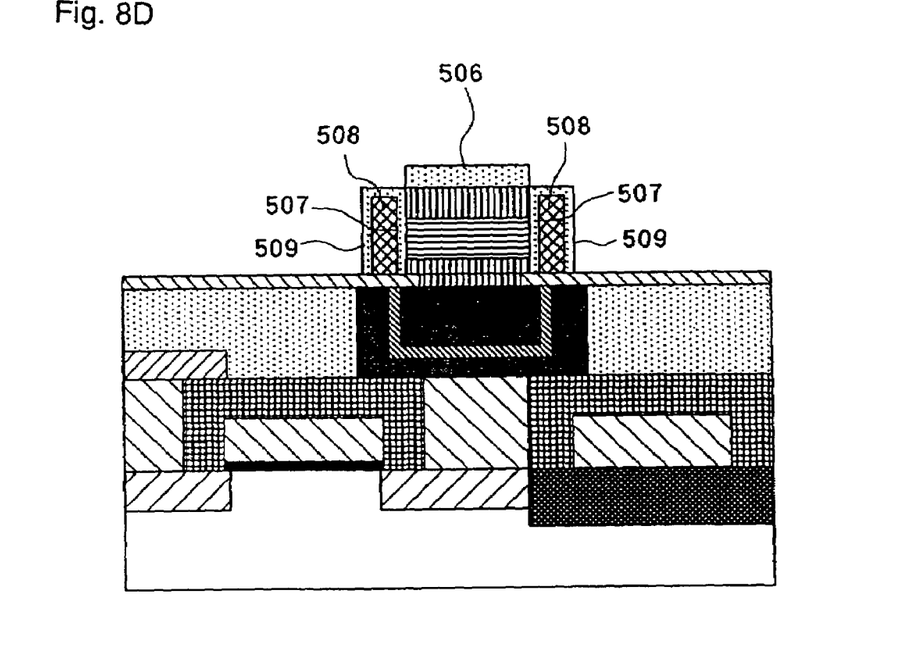
FIG. 8D is a cross-sectional view illustrating the fabrication process of the vertical structure of the nonvolatile RAM according to the present invention.

Next, gate dielectric layer 507 is formed on the whole surface and further electric-charge-storage gate electrode 508 formed of polycrystalline silicon is grown on it. The resulting surface is subjected to anisotropic etching, whereby gate dielectric layer 507 and electric-charge-storage gate electrode 508 are left exclusively in the sidewall of the above-described patterned stack section, as shown in FIG. 8D. Then, dielectric layer 509 is formed on the exposed surface of electric-charge-storage gate electrode 508 by means of the thermal oxidation.

Figure 8E:
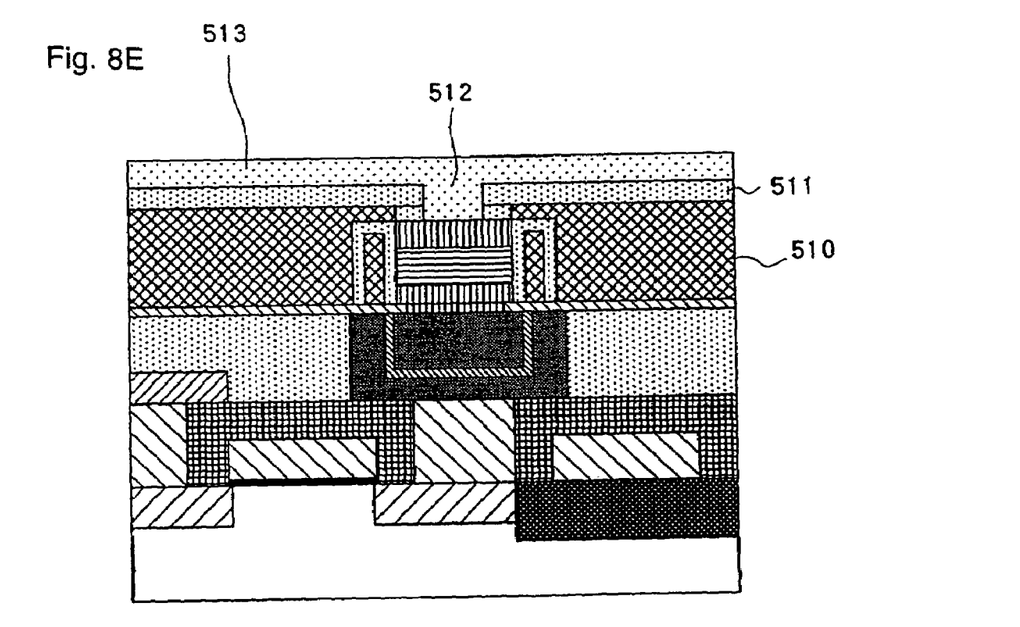
FIG. 8E is a cross-sectional view illustrating the fabrication process of the vertical structure of the nonvolatile RAM according to the present invention.

Next, polycrystalline silicon is grown on the entire surface, which is then smoothened to expose dielectric layer 506 by the CMP method to form TFT gate electrode 510. In the next step, the entire surface is covered with dielectric layer 511, then an opening for drawing out the electrode (electrode draw-out opening) 512 is provided so as to expose TFT drain electrode 505 and an electrode for supplying a potential (potential supply electrode) 513 is formed, whereby the structure shown in FIG. 8E is constructed. The later processes are the same as the corresponding fabrication processes of conventional DRAM or the like.

Configuring nonvolatile memory element 102 in a vertical structure as described above allows a cell structure to be downsized.

(Memory System)

Figure 9:
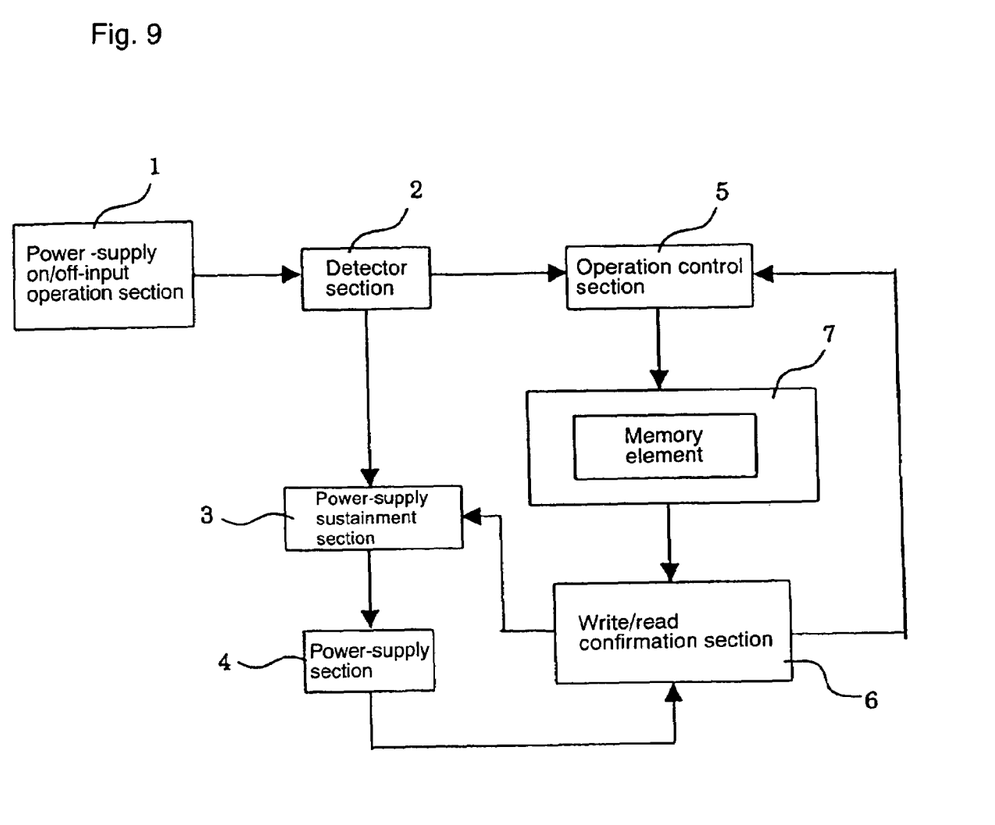
FIG. 9 is a block diagram representing the constructional outline of the memory system according to the present invention.

Explanation is next presented regarding a memory system provided with nonvolatile RAMs of the present invention. FIG. 9 illustrates an example of the memory system.

The memory system shown in FIG. 9 is a memory system capable of saving and restoring cell data in response to an on/off operation of an external power supply. The structure comprises power-supply on/off-input operation section 1, detector section 2, power-supply sustainment section 3, power supply section 4, operation control section 5, write/read confirmation section 6 and memory element 7.

Power-supply on/off-input operation section 1 is a section adapted for user's operation of performing an on/off operation on the external power supply. Power supply section 4 is a power supply provided in the interior of the subject system and when the external power supply is off, it supplies electric power to operation control section 5, write/read confirmation section 6 and memory element 7 over a pre-determined time duration. Detector section 2 is a section adapted for detecting whether an on-input operation or an off-input operation has been performed at power-supply on/off-input operation section 1. The detection result is supplied to power-supply sustainment section 3 and operation control section 5.

Memory element 7 is made up of the above-described nonvolatile RAM explained in each of the embodiments. Operation control section 5 performs conventional operations for memory element 7 to act as DRAM. Operation control section 5 further performs the save operation for saving cell data when receiving from the detection result detector section 2 of having detected an off-input operation, and also performs the restoration operation for restoring cell data when receiving the detection result from detector section 2 of having detected an on-input operation. Write/read confirmation section 6 is a section adapted for confirming the write of cell data into the nonvolatile memory element when the save operation of cell data is being performed. The confirmation result is supplied to power-supply sustainment section 3. Power-supply sustainment section 3 makes electric-power supply by power-supply section 4 start when receiving, from detector section 2, a detection result of having detected an on-input operation. Power-supply sustainment section 3 also makes electric-power supply by power-supply section 4 shut down when receiving, from detector section 2, a detection result of having detected an off-input operation and also receiving the information that the write of cell data has been completed.

Explanation next regards the operation of the subject memory system. When a power-supply off-input operation is operated at power-supply on/off-input operation section 1, detector section 2 detects the power-supply off-input operation and supplies the off-detection result to power-supply sustainment section 3 and operation control section 5. Power-supply sustainment section 3, when receiving the off-detection result of the power-supply off-input operation, makes power supply section 4 start the electric-power supply. Operation control section 5, when receiving the detection result of the power-supply off-input operation, executes a cell-data saving program on memory element 7. Since the save operation of cell data is as described above, the explanation is omitted here.

When completing the save of the cell data, write/read confirmation section 6 confirms the completion and provides the completion report to power-supply sustainment section 3. Power-supply sustainment section 3, when receiving the completion report, makes power supply section 4 shut down the electric-power supply. In this way, the cell data is saved and will be retained even when electric power supply is turned off.

Next, when a power-supply on-input operation is operated at power-supply on/off-input operation section 1, detector section 2 detects the power-supply on-input operation and supplies the on-detection result to operation control section 5. Operation control section 5, when receiving the on-detection result of the power-supply on-input operation, executes a cell-data restoration program on memory element 7. Since the save operation of cell data is as described above, the explanation is omitted here.

While the above-described memory system performs the save or restoration of cell data depending on power-supply on/off-input operation, it is also possible to carry out the save and restoration of cell data when the power supply is cut off due to the occurrence of obstacles such as electricity failure, as well. In this case, detector section 2 detects the presence of the power supply from an external electric power source and supplies the detection result to power-supply sustainment section 3 and operation control section 5.

In addition, configuration of a memory system can be envisaged in which a CPU is connected to memory element 7 by way of an interface circuit, the interface circuit blocking the electric power supply to the memory system when the CPU implements no access to memory element 7 to enable electric-power-saving, and the cell data is saved when the power supply is blocked and the saved cell data is restored when the power supply is tuned on. In this case, the save and restoration operations of cell data can be carried out by detecting, through detector section 2, the block and restoration of the electric power supply made by the interface circuit.

The above-described memory system is one example and the nonvolatile RAM of the present invention can be applied to a variety of memory systems. Basically, the nonvolatile RAM of the present invention can be applied to a variety types of memory systems provided with existing DRAMs if the memory system is provided with a means for detecting the presence of the electric-power supply and a means for sustaining the supply of electric-power over a predetermined time duration (the time sufficient for saving cell data) when the power supply is blocked. The means for sustaining the supply of electric-power can be a device capable of temporarily saving electric power through the use of a capacitor or the like, in addition to the means provided with a circuit, as shown in FIG. 9.

While preferred embodiments of the present invention have been described using specific terms, such description is for illustrative purposes only, and it is to be understood that changes and variations may be made without departing from the spirit or scope of the following claims.

What is claimed:

1. An nonvolatile random access memory, comprising
   a volatile memory element provided with a capacitor element adapted to store and sustain an electric charge only in a state in which electric power is supplied, and
   a nonvolatile memory element adapted to save said electric charge stored in said capacitor element when the supply of said electric power is cut off, wherein one end of said capacitor element is connected by way of said nonvolatile memory element to a potential supply line for supplying said electric charge, and
   wherein said nonvolatile memory element acts as a conductive element in a first state in which said electric power is supplied and acts as a cut-off element in a second state in which said electric power is not supplied, and said nonvolatile memory element has a threshold that varies in a case where the electric charge stored in said capacitor element corresponds to a predetermined potential level in said second state.

2. An nonvolatile random access memory according to claim 1, wherein said nonvolatile memory element is formed of a TFT element.

3. An nonvolatile random access memory according to claim 2, wherein said volatile memory element and said nonvolatile memory element are stacked on the same semiconductor substrate.

4. An nonvolatile random access memory according to claim 3, wherein said nonvolatile memory element has an electric-charge storage electrode adapted to save the electric charge stored in said capacitor element and has a window for injecting electric charge in a part of a dielectric layer formed under said electric-charge storage electrode, said window for injecting electric charge being formed of a dielectric film thinner than said dielectric layer.

5. An nonvolatile random access memory according to claim 3, provided with a plurality of unit cells, each including said volatile memory element and said nonvolatile memory element, one of a pair of the electrodes of said nonvolatile memory element intended for source and drain electrodes is shared by said unit cells.

6. An nonvolatile random access memory according to claim 5, wherein said pair of the electrodes are formed in a TFT substrate provided on said semiconductor substrate and said one of a pair of the electrodes shared by said unit cells is arranged to surround the other of said pair of electrodes.

7. An nonvolatile random access memory according to claim 6, wherein said nonvolatile memory element has an electric-charge storage electrode adapted to save the electric charge stored in said capacitor element and said electric-charge storage electrode is formed to cover the area including the entirety of said other of said pair of electrodes and also the portion of said one of a pair of the electrodes shared by said unit cells and adjacent to the outside periphery of said other of said pair of electrodes.

8. An nonvolatile random access memory according to claim 6, wherein said nonvolatile memory element has an electric-charge storage electrode adapted to save the electric charge stored in said capacitor element and said electric-charge storage electrode is formed to overlap a part of each of said other of said pair of electrodes and said one of a pair of the electrodes shared by said unit cells.

9. An nonvolatile random access memory according to claim 2, provided with a plurality of unit cells, each including said volatile memory element and said nonvolatile memory element wherein a control electrode of each nonvolatile memory element is shared by said unit cells.

10. An nonvolatile random access memory according to claim 1, provided with a TFT element in parallel to said nonvolatile memory element.

11. An nonvolatile random access memory according to claim 10, wherein said nonvolatile memory element and said TFT element are formed on the same semiconductor substrate.

12. An nonvolatile random access memory according to claim 11, wherein said nonvolatile memory element and said TFT element each have common source and drain.

13. A memory system comprising:
    a nonvolatile random access memory;
    a detecting means for detecting supply of an electric power from an external electric-power supply to said nonvolatile random access memory; and
    an electric-power sustaining means for implementing supply of an electric power to said nonvolatile random access memory over a predetermined time duration when said detecting means detects a shut down of said supply of electric power to said nonvolatile random access memory;
    said nonvolatile random access memory, comprising
    a volatile memory element provided with a capacitor element adapted to store and sustain electric charge only in a state in which electric power is supplied, and
    a nonvolatile memory element adapted to save said electric charge stored in said capacitor element when the supply of said electric power is cut off,
    wherein one end of said capacitor element is connected by way of said nonvolatile memory element to a potential supply line for supplying said electric charge, and
    wherein said nonvolatile memory element acts as a conductive element in a first state in which said electric power is supplied and acts as a cut-off element in a second state in which said electric power is not supplied, and said nonvolatile memory element has a threshold that varies in a case where the electric charge stored in said capacitor element corresponds to a predetermined potential level in said second state.

14. A method of fabricating nonvolatile random access memory, which has a unit cell made up of: a volatile memory element provided with a capacitor element adapted to store and sustain an electric charge only in a state in which electric power is supplied; and a nonvolatile memory element provided with an electric-charge storage electrode adapted to save said electric charge stored in said capacitor element when the supply of said electric power is cut off; wherein one end of said capacitor element is connected by way of said nonvolatile memory element to a potential supply line for supplying said electric charge, comprising the steps of stacking a pair of electrodes intended for the source and drain of said nonvolatile memory element on the semiconductor substrate on which said volatile memory element is formed and forming said pair of electrodes to a predetermined pattern, sequentially depositing a dielectric layer and a silicon-based layer for said electric-charge storage electrode so as to cover the portion of the stacked pair of electrodes formed in said predetermined pattern, and implementing the anisotropic etching in such a manner that the deposited dielectric layer and said layer for said electric-charge storage electrode are left in the sidewall of said portion of the stacked pair of electrodes.

* * * * *